(12) United States Patent
Kazuta et al.

(10) Patent No.: US 11,594,366 B2
(45) Date of Patent: Feb. 28, 2023

(54) MULTILAYER COIL COMPONENT AND MOUNTED STRUCTURE OF THE MULTILAYER COIL COMPONENT

(71) Applicant: TDK CORPORATION, Tokyo (JP)

(72) Inventors: Youichi Kazuta, Tokyo (JP); Yuichi Takubo, Tokyo (JP); Yuto Shiga, Tokyo (JP); Junichiro Urabe, Tokyo (JP); Noriaki Hamachi, Tokyo (JP); Kazuya Tobita, Tokyo (JP); Toshinori Matsuura, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 17/514,020

(22) Filed: Oct. 29, 2021

(65) Prior Publication Data

US 2022/0139610 A1    May 5, 2022

(30) Foreign Application Priority Data

Nov. 2, 2020    (JP) .............................. JP2020-183742

(51) Int. Cl.
  *H01F 27/29*    (2006.01)
  *H05K 1/18*    (2006.01)
(52) U.S. Cl.
  CPC ........... *H01F 27/292* (2013.01); *H05K 1/181* (2013.01); *H05K 2201/1003* (2013.01)
(58) Field of Classification Search
  CPC .................................................. H01F 27/292

USPC ......................................................... 174/260
See application file for complete search history.

(56) References Cited

U.S. PATENT DOCUMENTS

| 8,766,100 | B2* | 7/2014 | Yuan | ...................... | H01L 24/32 |
| | | | | | 174/255 |
| 9,000,304 | B2* | 4/2015 | Kohda | .................... | B81B 7/007 |
| | | | | | 310/311 |
| 2014/0041914 | A1* | 2/2014 | Hattori | ................... | H01G 4/232 |
| | | | | | 174/260 |
| 2015/0136463 | A1* | 5/2015 | Lee | ......................... | H01G 4/232 |
| | | | | | 361/301.4 |
| 2018/0190435 | A1* | 7/2018 | Kishi | ........................ | H01G 4/30 |
| 2018/0342341 | A1* | 11/2018 | Aoki | ........................ | H01G 4/30 |
| 2020/0234865 | A1 | 7/2020 | Aoki et al. | | |
| 2020/0350107 | A1 | 11/2020 | Aoki et al. | | |

FOREIGN PATENT DOCUMENTS

JP        2018-200966 A    12/2018

* cited by examiner

*Primary Examiner* — Stanley Tso
(74) *Attorney, Agent, or Firm* — Oliff PLC

(57) ABSTRACT

A multilayer coil component 1 includes an element body 2, a pair of terminal electrodes 3, and a glass layer G provided on the terminal electrode 3. Each of the pair of terminal electrodes 3 is provided with a plurality of first projecting portions 33 tapered toward the other facing terminal electrode 3 side in an end portion 31*b* facing the side in the facing direction of a pair of end surfaces 2*a* and 2*b*. The glass layer G is provided along the edge of the terminal electrode 3 including at least the first projecting portion 33 in the end portion 31*b* of the terminal electrode 3.

6 Claims, 6 Drawing Sheets

MULTILAYER COIL COMPONENT AND MOUNTED STRUCTURE OF THE MULTILAYER COIL COMPONENT

TECHNICAL FIELD

The present invention relates to a multilayer coil component and a mounted structure of the multilayer coil component.

BACKGROUND

A multilayer coil component includes an element body and a pair of terminal electrodes disposed over the mounting and end surfaces of the element body (see, for example, Japanese Unexamined Patent Publication No. 2018-200966).

SUMMARY

The multilayer coil component is solder-mounted on the land electrode of a circuit board or the like. The solder travels wet through the terminal electrode and is formed up to the end of the terminal electrode. When the ends of the land electrode and the solder overlap the end of the terminal electrode with the multilayer coil component mounted on the land electrode, the stress generated as a result of the bending of the circuit board or the like may be concentrated at the end of the terminal electrode. As a result, the element body of the multilayer coil component may crack from the end of the terminal electrode.

An object of one aspect of the present invention is to provide a multilayer coil component and a mounted structure of the multilayer coil component capable of suppressing the cracking of the element body in the case of mounting.

A multilayer coil component according to one aspect of the present invention includes: an element body formed by laminating a plurality of insulator layers and having a pair of end surfaces facing each other, a pair of main surfaces facing each other, and a pair of side surfaces facing each other, one of the main surfaces being a mounting surface; a pair of terminal electrodes disposed in recessed portions formed on the mounting surface on the respective end surface sides of the element body; and a glass layer provided on the terminal electrode, in which each of the pair of terminal electrodes is provided with a plurality of first projecting portions tapered toward the other facing terminal electrode side in a first end portion facing the side in a facing direction of the pair of end surfaces, and the glass layer is provided along an edge of the terminal electrode including at least the first projecting portion in the first end portion of the terminal electrode.

In the multilayer coil component according to one aspect of the present invention, the terminal electrode is provided with the plurality of first projecting portions tapered toward the other facing terminal electrode side in the first end portion. In the multilayer coil component having this configuration, the glass layer is provided along the edge of the terminal electrode including at least the first projecting portion in the first end portion of the terminal electrode. No solder is formed on the glass layer. Accordingly, in the multilayer coil component, no solder is formed on the glass layer covering the first end portion in the event of solder mounting on a land electrode of a circuit board or the like. As a result, the positions of the ends of the land electrode and the solder do not overlap the position of the end of the terminal electrode when the multilayer coil component is mounted on the land electrode. In other words, in the facing direction of the pair of main surfaces of the element body, the positions of the ends of the land electrode and the solder do not match the position of the end of the terminal electrode. Accordingly, stress concentration at the end of the terminal electrode can be avoided in the multilayer coil component. As a result, in the multilayer coil component, cracking of the element body in the case of mounting can be suppressed.

In one embodiment, the glass layer may cover 60% or more of an area of the projecting portion. In this configuration, solder formation in the first end portion of the terminal electrode can be more reliably avoided.

In one embodiment, an edge of the glass layer on the end surface side may have a wave shape corresponding to the plurality of first projecting portions. In this configuration, a region where solder is formed in the terminal electrode can be ensured while the glass layer covers the edge of the first projecting portion.

In one embodiment, the pair of terminal electrodes may also be disposed in recessed portions respectively formed on the pair of end surfaces, a second end portion of the terminal electrode disposed on the end surface on the other main surface side may be provided with a plurality of second projecting portions tapered toward the main surface side, and the glass layer may be provided along an edge of the terminal electrode including at least the second projecting portion in the second end portion of the terminal electrode. In this configuration, no solder is formed on the glass layer covering the second end portion in the event of solder mounting on the land electrode of the circuit board or the like. As a result, the position of the end of the solder does not overlap the position of the end of the terminal electrode when the multilayer coil component is mounted on the land electrode. Accordingly, stress concentration at the end of the terminal electrode can be avoided in the multilayer coil component. As a result, in the multilayer coil component, cracking of the element body in the case of mounting can be suppressed.

In one embodiment, each of the pair of terminal electrodes may be provided with a plurality of third projecting portions tapered toward the end surface side in a third end portion on the end surface side, and the glass layer may be provided along an edge of the terminal electrode including at least the third projecting portion in the third end portion of the terminal electrode. In this configuration, no solder is formed on the glass layer covering the first end portion and the third end portion in the event of solder mounting on the land electrode of the circuit board or the like. As a result, the positions of the ends of the land electrode and the solder do not overlap the position of the end of the terminal electrode when the multilayer coil component is mounted on the land electrode. Accordingly, stress concentration at the end of the terminal electrode can be avoided in the multilayer coil component. As a result, in the multilayer coil component, cracking of the element body in the case of mounting can be suppressed.

A mounted structure according to one aspect of the present invention includes: the multilayer coil component described above; a circuit board provided with a land electrode where the multilayer coil component is mounted; and solder disposed between the terminal electrode of the coil component and the land electrode, in which the solder is not formed on the glass layer, and ends of the land electrode and the solder do not overlap the first end portion of the terminal electrode when viewed from a facing direction of the pair of main surfaces of the element body.

In the mounted structure according to one aspect of the present invention, the ends of the land electrode and the solder and the first end portion of the terminal electrode do not overlap when viewed from the facing direction of the pair of main surfaces of the element body. In this manner, in the mounted structure of the multilayer coil component, the positions of the ends of the land electrode and the solder and the first end portion of the terminal electrode are misaligned. Accordingly, stress concentration at the end of the terminal electrode can be avoided in the mounted structure of the multilayer coil component. As a result, in the mounted structure of the multilayer coil component, cracking of the element body in the case of mounting can be suppressed.

According to one aspect of the present invention, cracking of the element body in the case of mounting can be suppressed.

DETAILED DESCRIPTION

Figure 1:
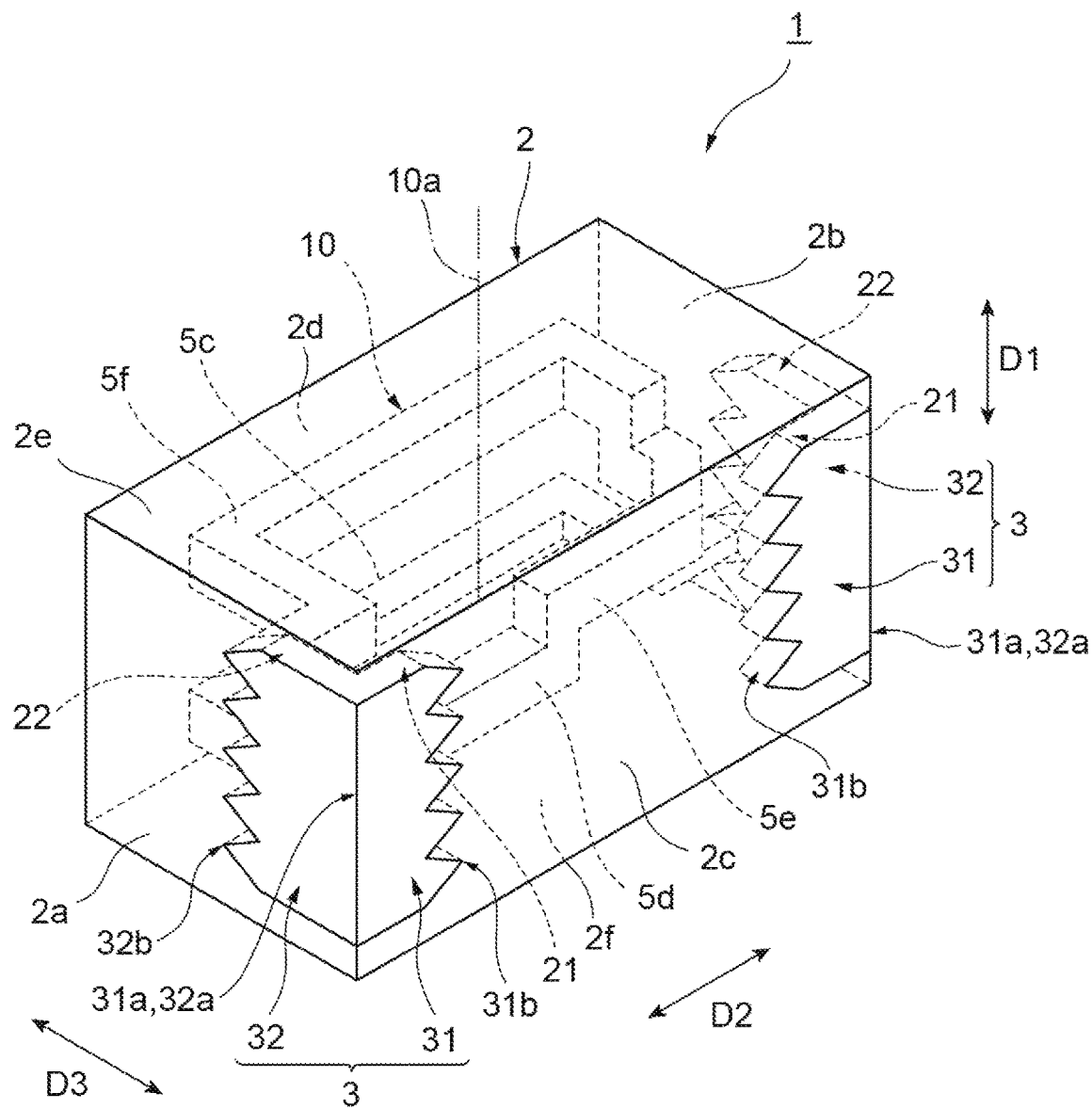
FIG. 1 is a perspective view of a multilayer coil component according to an embodiment.

Hereinafter, a preferred embodiment of the present invention will be described in detail with reference to the accompanying drawings. It should be noted that the same or equivalent elements in the description of the drawings are denoted by the same reference numerals with redundant description omitted.

Figure 2:
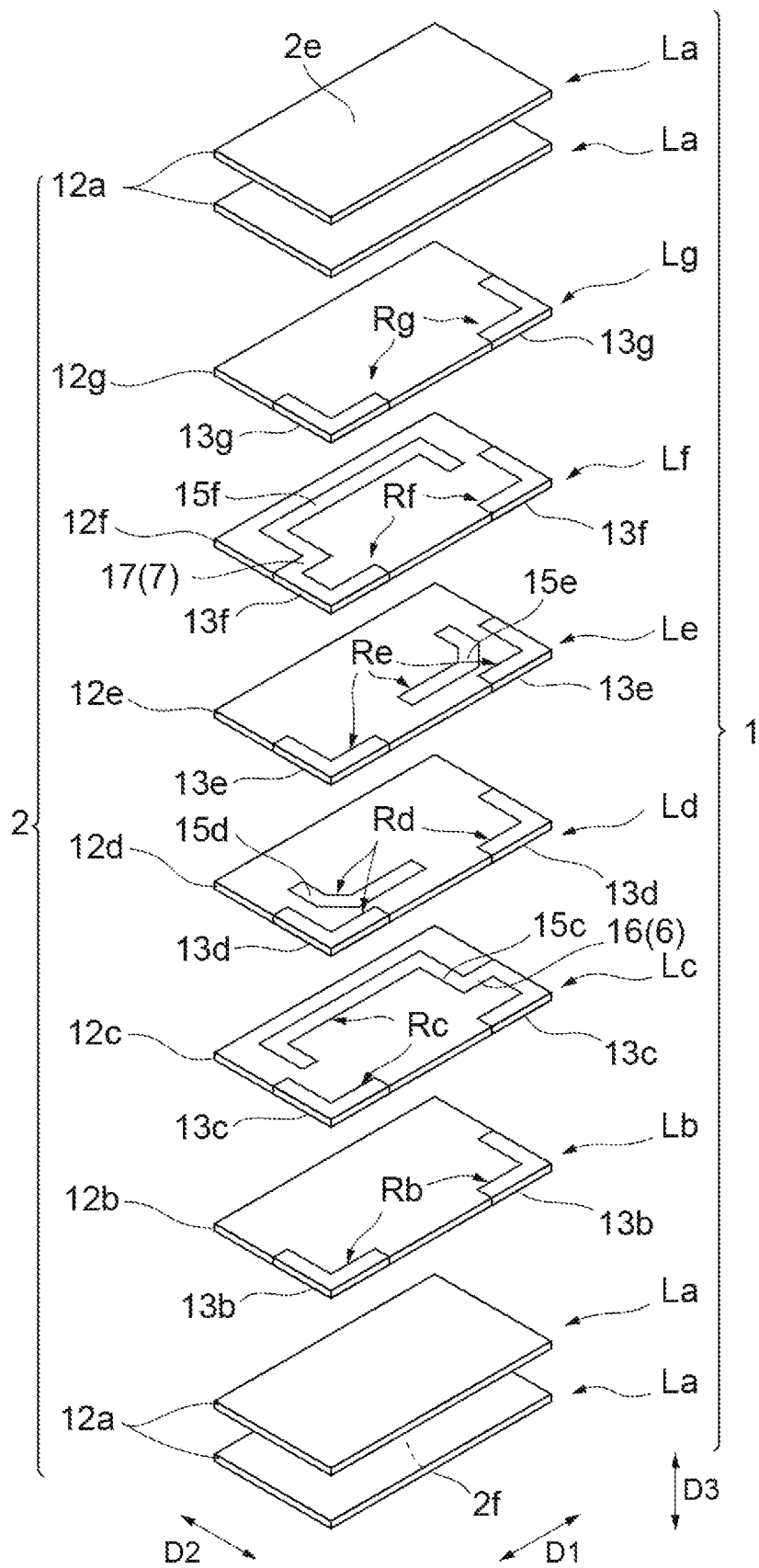
FIG. 2 is an exploded perspective view of the multilayer coil component of FIG. 1.

A multilayer coil component according to an embodiment will be described with reference to FIGS. 1 and 2. FIG. 1 is a perspective view of a multilayer coil component according to an embodiment. FIG. 2 is an exploded perspective view of the multilayer coil component of FIG. 1. As illustrated in FIGS. 1 and 2, a multilayer coil component 1 according to the embodiment includes an element body 2, a pair of terminal electrodes 3, a glass layer G (see FIGS. 3 and 4), a plurality of coil conductors 5c, 5d, 5e, and 5f, and connecting conductors 6 and 7.

The element body 2 has a rectangular parallelepiped shape. The rectangular parallelepiped shape includes a rectangular parallelepiped shape in which the corner and ridge portions are chamfered and a rectangular parallelepiped shape in which the corner and ridge portions are rounded. The element body 2 has end surfaces 2a and 2b, main surfaces 2c and 2d, and side surfaces 2e and 2f as outer surfaces. The end surfaces 2a and 2b face each other. The main surfaces 2c and 2d face each other. The side surfaces 2e and 2f face each other. In the following description, the direction in which the side surfaces 2e and 2f face each other is a first direction D1, the direction in which the end surfaces 2a and 2b face each other is a second direction D2, and the direction in which the main surfaces 2c and 2d face each other is a third direction D3. The first direction D1, the second direction D2, and the third direction D3 are substantially orthogonal to each other.

The end surfaces 2a and 2b extend in the third direction D3 so as to connect the main surfaces 2c and 2d. In addition, the end surfaces 2a and 2b extend in the first direction D1 so as to connect the side surfaces 2e and 2f. The main surfaces 2c and 2d extend in the second direction D2 so as to connect the end surfaces 2a and 2b. In addition, the main surfaces 2c and 2d extend in the first direction D1 so as to connect the side surfaces 2e and 2f. The side surfaces 2e and 2f extend in the third direction D3 so as to connect the main surfaces 2c and 2d. In addition, the side surfaces 2e and 2f extend in the second direction D2 so as to connect the end surfaces 2a and 2b.

The main surface 2c is a mounting surface and is a surface facing another electronic device (not illustrated) when, for example, the multilayer coil component 1 is mounted on the electronic device (such as a circuit base material and a multilayer electronic component). The end surfaces 2a and 2b are surfaces continuous from the mounting surface (that is, the main surface 2c).

The length of the element body 2 in the second direction D2 is longer than the length of the element body 2 in the third direction D3 and the length of the element body 2 in the first direction D1. The length of the element body 2 in the third direction D3 and the length of the element body 2 in the first direction D1 are equivalent to each other. In other words, in the present embodiment, the end surfaces 2a and 2b have a square shape and the main surfaces 2c and 2d and the side surfaces 2e and 2f have a rectangular shape. The length of the element body 2 in the second direction D2 may be equivalent to or shorter than the length of the element body 2 in the third direction D3 and the length of the element body 2 in the first direction D1. The length of the element body 2 in the third direction D3 and the length of the element body 2 in the first direction D1 may be different from each other.

It should be noted that "equivalent" in the present embodiment may mean not only "equal" but also a value including a slight difference, a manufacturing error, or the like in a preset range. For example, it is defined that a plurality of values are equivalent insofar as the plurality of values are included in the range of 95% to 105% of the average value of the plurality of values.

A pair of recessed portions 21 and a pair of recessed portions 22 are provided on the outer surface of the element body 2. Specifically, one recessed portion 21 is provided on the end surface 2a side of the main surface 2c and is recessed toward the main surface 2d. The other recessed portion 21 is provided on the end surface 2b side of the main surface 2c and is recessed toward the main surface 2d. One recessed portion 22 is provided on the main surface 2c side of the end surface 2a and is recessed toward the end surface 2b. The other recessed portion 22 is provided on the main surface 2c side of the end surface 2b and is recessed toward the end surface 2a.

One recessed portion 21 and one recessed portion 22 are continuously provided and correspond to one terminal electrode 3. The other recessed portion 21 and the other recessed portion 22 are continuously provided and correspond to the other terminal electrode 3. The recessed portion 21 and the recessed portion 22 have, for example, the same shape. In the present embodiment, the recessed portion 21 and the recessed portion 22 have different shapes in that the width of the recessed portion 21 (length in the second direction D2) is shorter than the width of the recessed portion 22 (length in the third direction D3). The pair of recessed portions 21 and the pair of recessed portions 22 are provided apart from the main surface 2d and the side surfaces 2e and 2f. The pair of recessed portions 21 are provided apart from each other in the second direction D2.

The element body 2 is formed by laminating a plurality of element body layers (insulator layers) 12a to 12g in the first direction D1. In other words, the lamination direction of the element body 2 is the first direction D1. The configuration of the lamination will be described in detail later. In the actual element body 2, the plurality of element body layers 12a to 12g are integrated to the extent that the boundaries between the layers cannot be visually recognized. The element body layers 12a to 12g are made of, for example, a magnetic material (Ni—Cu—Zn-based ferrite material, Ni—Cu—Zn—Mg-based ferrite material, Ni—Cu-based ferrite material, or the like). The magnetic material constituting the element body layers 12a to 12g may contain a Fe alloy or the like. The element body layers 12a to 12g may be made of a non-magnetic material (glass ceramic material, dielectric material, or the like).

The terminal electrode 3 is provided on the element body 2. Specifically, the terminal electrode 3 is disposed in the recessed portions 21 and 22. More specifically, one terminal electrode 3 is disposed in one recessed portion 21 and one recessed portion 22 and the other terminal electrode 3 is disposed in the other recessed portion 21 and the other recessed portion 22. The pair of terminal electrodes 3 have, for example, the same shape. In the present embodiment, the conductor part 31 and a conductor part 32 have different shapes in that the width of the conductor part 31 (length in the second direction D2) is shorter than the width of the conductor part 32 (length in the third direction D3). The pair of terminal electrodes 3 are provided on the element body 2 and apart from each other in the second direction D2. The terminal electrode 3 is formed by laminating a plurality of terminal electrode layers 13b, 13c, 13d, 13e, 13f, and 13g in the first direction D1. In other words, the lamination direction of the terminal electrode layers 13b to 13g is the first direction D1. In the actual terminal electrode 3, the plurality of terminal electrode layers 13b to 13g are integrated to the extent that the boundaries between the layers cannot be visually recognized.

The terminal electrode 3 has an L shape when viewed from the first direction D1 (see FIG. 1). The terminal electrode 3 has the conductor part 31 and the conductor part 32 provided integrally with each other. The conductor part 31 extends in the second direction D2. The conductor part 31 extends in the third direction D3. The conductor part 31 is disposed in the recessed portion 21. The conductor part 32 is disposed in the recessed portion 22.

The conductor part 31 includes an end portion 31a and an end portion (first end portion) 31b facing each other in the second direction D2. The conductor part 32 includes an end portion 32a and an end portion (second end portion) 32b facing each other in the third direction D3. The end portion 31a and the end portion 32a are interconnected and are provided integrally with each other. The end portion 31b of the conductor part 31 of one terminal electrode 3 and the end portion 31b of the conductor part 31 of the other terminal electrode 3 face each other in the second direction D2.

Figure 3:
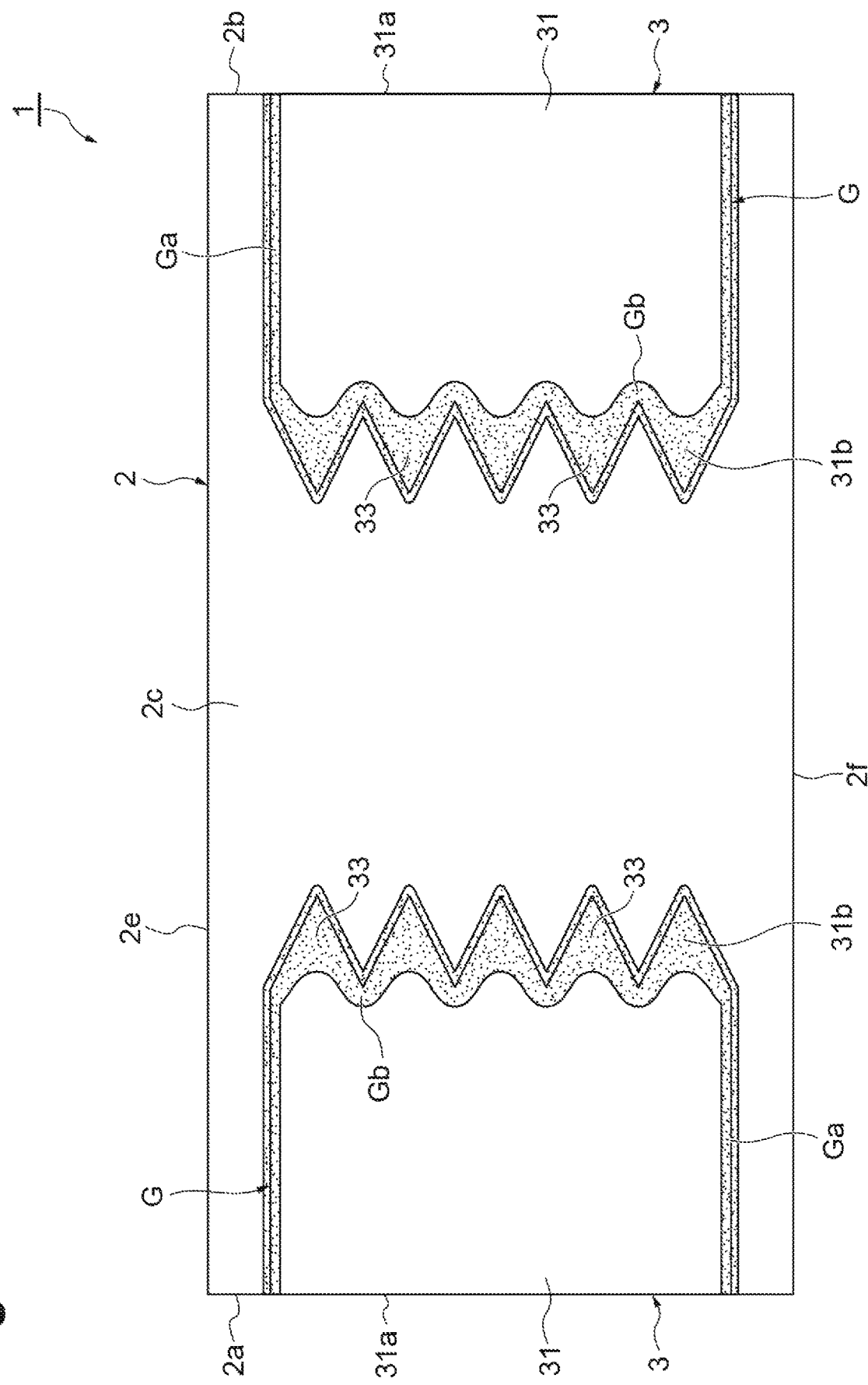
FIG. 3 is a diagram schematically illustrating a main surface of an element body.

FIG. 3 is a diagram schematically illustrating a main surface of the element body. As illustrated in FIG. 3, the end portion 31a of the conductor part 31 is provided with a plurality of (here, five) first projecting portions 33. When viewed from the third direction D3, the first projecting portion 33 is tapered toward the other facing terminal electrode 3 (end surface 2a or end surface 2b). The tapering may be any shape in which the first projecting portion 33 as a whole is tapered toward the tip when viewed from the third direction D3. For example, in a case where the first projecting portion 33 is tapered toward the tip in its overall shape, it can be said that the first projecting portion 33 has a tapered shape even if the surface of the first projecting portion 33 as viewed from the third direction D3 is uneven and protrudes or is recessed in part. In the present embodiment, the first projecting portion 33 has a triangular shape when viewed from the third direction D3. Here, the triangular shape may be substantially triangular when viewed from the third direction D3.

Figure 4:
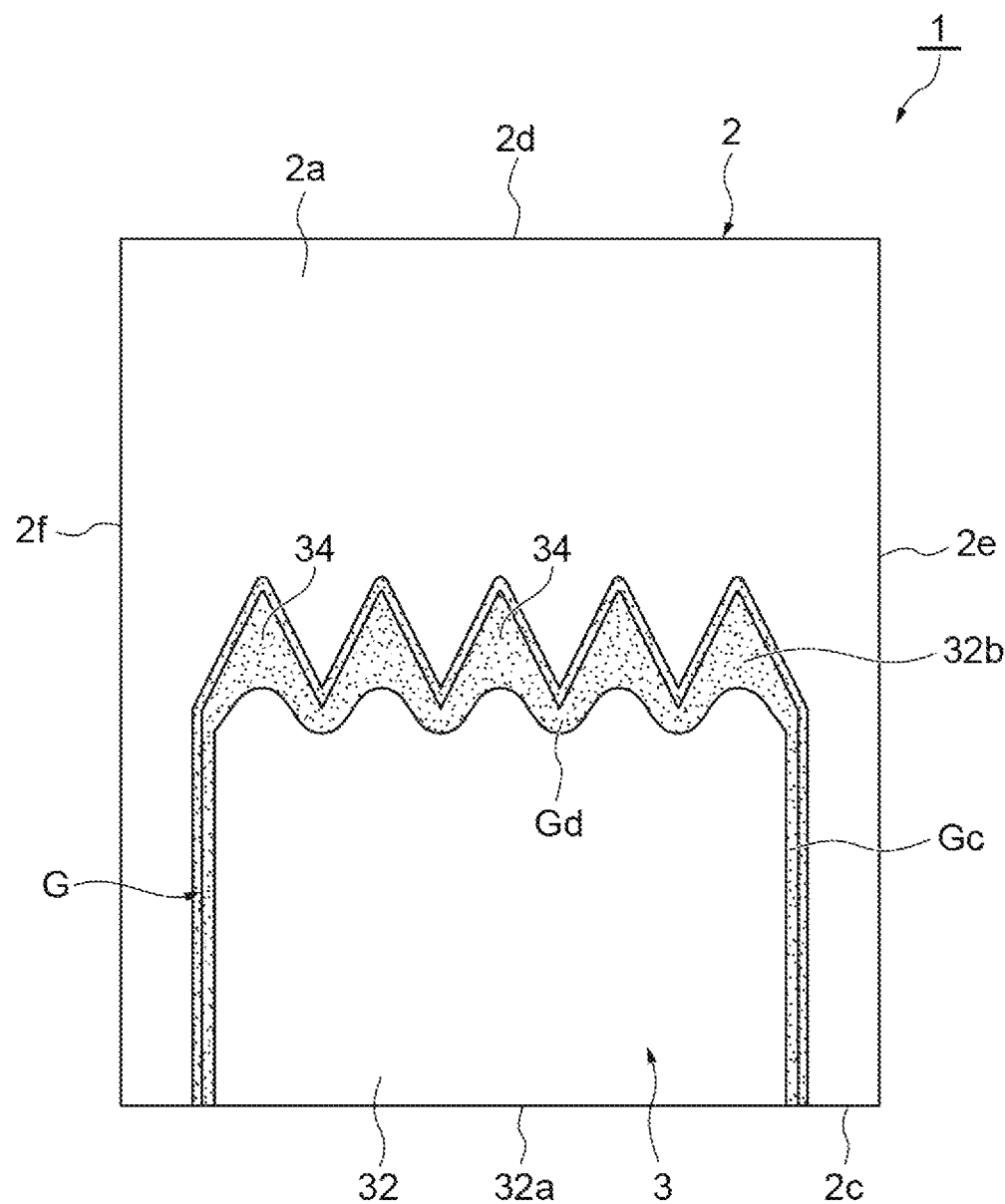
FIG. 4 is a diagram schematically illustrating an end surface of the element body.

FIG. 4 is a diagram schematically illustrating an end surface of the element body. As illustrated in FIG. 4, the end portion 32b of the conductor part 32 is provided with a plurality of (here, five) second projecting portions 34. The second projecting portion 34 is tapered toward the main surface 2d when viewed from the second direction D2. In the present embodiment, the second projecting portion 34 has a triangular shape when viewed from the second direction D2.

The terminal electrode 3 may be provided with a plating layer (not illustrated) containing, for example, Ni, Sn, Au, and so on by electroplating or electroless plating. The plating layer may have, for example, a Ni plating film containing Ni and covering the terminal electrode 3 and an Au plating film containing Au and covering the Ni plating film.

As illustrated in FIGS. 3 and 4, the glass layer G is made of, for example, the same component as the glass component contained in the element body 2. The glass layer G is provided on the terminal electrode 3 along the outer edge of the terminal electrode 3. The glass layer G is provided so as to surround the terminal electrode 3.

As illustrated in FIG. 3, at the conductor part 31, the glass layer G is provided in a region Ga along the outer edge on the side surface 2e side and the outer edge on the side surface 2f side and a region Gb covering the first projecting portion 33 of the end portion 31b. In the present embodiment, the glass layer G is provided over the main surface 2c of the element body 2 and the conductor part 31. The glass layer G covers most of the first projecting portion 33 in the region Gb. Specifically, the region Gb covers the entire area on the tip side of the first projecting portion 33 and is provided so as to expose a part of the base end side of the first projecting portion 33. The region Gb covers a predetermined area or more of the area of the first projecting portion 33. The predetermined area is, for example, an area that covers 60% or more of the region between the tip of the first projecting portion 33 and the base end of the first projecting portion 33 and is preferably an area that covers 80% or more. The edge of the region Gb on the end surface 2a or end surface 2b side is along the unevenness formed by the first projecting portion 33. The edge of the region Gb on the end surface 2a or end surface 2b side has a curved wave shape (sinusoidal shape). The wave shape of the edge of the region Gb on the end surface 2a or end surface 2b side is convex in the first projecting portion 33 and convex at the valley configured by the adjacent first projecting portions 33.

As illustrated in FIG. 4, at the conductor part 32, the glass layer G is provided in a region Gc along the outer edge on the side surface 2e side and the outer edge on the side surface 2f side and a region Gd covering the second projecting portion 34 of the end portion 32b. The region Gc is continuous with the region Ga. In the present embodiment, the glass layer G is provided over the end surface 2a or the end surface 2b of the element body 2 and the conductor part 32. The glass layer G covers most of the second projecting portion 34 in the region Gd. Specifically, the region Gd covers the entire area on the tip side of the second projecting portion 34 and is provided so as to expose a part of the base end side of the second projecting portion 34. The region Gd covers a predetermined area or more of the area of the second projecting portion 34. The edge of the region Gd on the main surface 2c side is along the unevenness formed by the second projecting portion 34. The edge of the region Gd on the main surface 2c side has a curved wave shape (sinusoidal shape). The wave shape of the edge of the region Gd on the main surface 2c side is convex in the second projecting portion 34 and convex at the valley configured by the adjacent second projecting portions 34.

The plurality of coil conductors 5c to 5f illustrated in FIG. 1 are interconnected and constitute a coil 10 in the element body 2. A coil axis 10a of the coil 10 is provided along the first direction D1. The coil conductors 5c to 5f are disposed so as to overlap at least in part when viewed from the first direction D1. The coil conductors 5c to 5f are disposed apart from the end surfaces 2a and 2b, the main surfaces 2c and 2d, and the side surfaces 2e and 2f.

The coil conductors 5c to 5f are configured by laminating a plurality of coil conductor layers 15c, 15d, 15e, and 15f in the first direction D1. In other words, the plurality of coil conductor layers 15c to 15f are disposed so as to overlap in entirety when viewed from the first direction D1. The coil conductors 5c to 5f may be configured by one coil conductor layer 15c to 15f. It should be noted that only one coil conductor layer 15c to 15f is illustrated in FIG. 2. In the actual coil conductors 5c to 5f, the plurality of coil conductor layers 15c to 15f are integrated to the extent that the boundaries between the layers cannot be visually recognized.

The connecting conductor 6 extends in the second direction D2 and is connected to the coil conductor 5c and the other conductor part 32. The connecting conductor 7 extends in the second direction D2 and is connected to the coil conductor 5f and one conductor part 32. The connecting conductors 6 and 7 are configured by laminating a plurality of connecting conductor layers 16 and 17 in the first direction D1. It should be noted that only one connecting conductor layer 16 and 17 is illustrated in FIG. 2. In the actual connecting conductors 6 and 7, the plurality of connecting conductor layers 16 and 17 are integrated to the extent that the boundary between the layers cannot be visually recognized.

The terminal electrode layers 13b to 13g, the coil conductor layers 15c to 15f, and the connecting conductor layers 16 and 17 described above are made of a conductive material (such as Ag or Pd). Each of the layers may be made of the same material or may be made of different materials.

The multilayer coil component 1 includes a plurality of layers La, Lb, Lc, Ld, Le, Lf, and Lg. The multilayer coil component 1 is configured by, for example, laminating two layers La, one layer Lb, three layers Lc, three layers Ld, three layers Le, three layers Lf, one layer Lg, and two layers La in order from the side surface 2f side. It should be noted that one is illustrated and the other two are not illustrated in FIG. 2 regarding each of the three layers Lc, the three layers Ld, the three layers Le, and the three layers Lf.

The element body layer 12a constitutes the layer La.

The layer Lb is configured by combining the element body layer 12b and the pair of terminal electrode layers 13b with each other. The element body layer 12b is provided with a defective portion Rb corresponding in shape to the pair of terminal electrode layers 13b. The pair of terminal electrode layers 13b are fitted into the defective portion Rb. The element body layer 12b and the pair of terminal electrode layers 13b as a whole have a mutually complementary relationship.

The layer Lc is configured by combining the element body layer 12c and the pair of terminal electrode layers 13c and the coil conductor layer 15c with each other. The element body layer 12c is provided with a defective portion Rc corresponding in shape to the pair of terminal electrode layers 13 and the coil conductor layer 15c. The pair of terminal electrode layers 13c, the coil conductor layer 15c, and the connecting conductor layer 16 are fitted into the defective portion Rc. The element body layer 12c and the pair of terminal electrode layers 13c, the coil conductor layer 15c, and the connecting conductor layer 16 as a whole have a mutually complementary relationship.

The layer Ld is configured by combining the element body layer 12d and the pair of terminal electrode layers 13d and the coil conductor layer 15d with each other. The element body layer 12d is provided with a defective portion Rd corresponding in shape to the pair of terminal electrode layers 13d and the coil conductor layer 15d. The pair of terminal electrode layers 13d and the coil conductor layer 15d are fitted into the defective portion Rd. The element body layer 12d and the pair of terminal electrode layers 13d and the coil conductor layer 15d as a whole have a mutually complementary relationship.

The layer Le is configured by combining the element body layer 12e and the pair of terminal electrode layers 13e and the coil conductor layer 15e with each other. The element body layer 12e is provided with a defective portion Re corresponding in shape to the pair of terminal electrode layers 13e and the coil conductor layer 15e. The pair of terminal electrode layers 13e and the coil conductor layer 15e are fitted into the defective portion Re. The element body layer 12e and the pair of terminal electrode layers 13e and the coil conductor layer 15e as a whole have a mutually complementary relationship.

The layer Lf is configured by combining the element body layer 12f and the pair of terminal electrode layers 13f, the coil conductor layer 15f, and the connecting conductor layer 17 with each other. The element body layer 12f is provided with a defective portion Rf corresponding in shape to the pair of terminal electrode layers 13, the coil conductor layer 15f, and the connecting conductor layer 17. The pair of terminal electrode layers 13f, the coil conductor layer 15f, and the connecting conductor layer 17 are fitted into the defective portion Rf. The element body layer 12f and the pair of terminal electrode layers 13, the coil conductor layer 15f, and the connecting conductor layer 17 as a whole have a mutually complementary relationship.

The layer Lg is configured by combining the element body layer 12g and the pair of terminal electrode layers 13g with each other. The element body layer 12g is provided with a defective portion Rg corresponding in shape to the pair of terminal electrode layers 13g. The pair of terminal electrode layers 13g are fitted into the defective portion Rg. The element body layer 12g and the pair of terminal electrode layers 13g as a whole have a mutually complementary relationship.

The defective portions Rb, Rc, Rd, Re, Rf, and Rg are integrated and constitute the pair of recessed portions 21 and the pair of recessed portions 22 described above. Basically, the width of the defective portions Rb to Rg (hereinafter, the width of the defective portion) is set to be wider than the width of the terminal electrode layers 13b to 13g, the coil conductor layers 15c to 15f, and the connecting conductor layers 16 and 17 (hereinafter, the width of the conductor portion). The width of the defective portion may be intentionally set to be narrower than the width of the conductor portion so that adhesiveness is improved between the element body layers 12b, 12c, 12d, 12e, 12f, and 12g and the terminal electrode layers 13b to 13g, the coil conductor layers 15c to 15f, and the connecting conductor layers 16 and 17. The value obtained by subtracting the width of the conductor portion from the width of the defective portion is, for example, preferably −3 μm or more and 10 μm or less and more preferably 0 μm or more and 10 μm or less.

An example of how to manufacture the multilayer coil component 1 according to the embodiment will be described.

First, an element body forming layer is formed by applying element body paste containing the material constituting the element body layers 12a to 12g described above and a photosensitive material onto a base material (such as a PET film). The photosensitive material contained in the element body paste may be either a negative-type photosensitive material or a positive-type photosensitive material, and known photosensitive materials can be used. Subsequently, the element body forming layer is exposed and developed by, for example, a photolithography method using a Cr mask. Then, an element body pattern from which a shape corresponding to the shape of the conductor forming layer to be described later is removed is formed on the base material. The element body pattern is a layer that becomes the element body layers 12b to 12g after heat treatment. In other words, an element body pattern provided with a defective portion that becomes the defective portions Rb to Rg is formed. It should be noted that "photolithography method" of the present embodiment may be any by which a layer that contains a photosensitive material and is to be processed is processed into a desired pattern by exposure and development and is not limited to the type of the mask and so on.

Meanwhile, the conductor forming layer is formed by applying conductor paste containing the materials constituting the terminal electrode layers 13b to 13g, the coil conductor layers 15c to 15f, and the connecting conductor layers 16 and 17 described above and a photosensitive material onto a base material (such as a PET film). The photosensitive material contained in the conductor paste may be either a negative-type photosensitive material or a positive-type photosensitive material, and known photosensitive materials can be used. Subsequently, the conductor forming layer is exposed and developed by, for example, a photolithography method using a Cr mask and a conductor pattern is formed on the base material. The conductor pattern is a layer that becomes the terminal electrode layers 13b to 13g, the coil conductor layers 15c to 15g, and the connecting conductor layers 16 and 17 after heat treatment.

Subsequently, the element body forming layer is transferred from the base material onto a support body. In the present embodiment, two element body forming layers are laminated on the support body by repeating the element body forming layer transfer process twice. The element body forming layers become the layer La after heat treatment.

Subsequently, the conductor pattern and the element body pattern are repeatedly transferred onto the support body. As a result, the conductor pattern and the element body pattern are laminated in the first direction D1. Specifically, first, the conductor pattern is transferred from the base material onto the element body forming layer. Next, the element body pattern is transferred from the base material onto the element body forming layer. The conductor pattern is combined with the defective portion of the element body pattern, and the element body pattern and the conductor pattern become the same layer on the element body forming layer. Further, the conductor pattern and element body pattern transfer process is repeatedly performed and the conductor pattern and the element body pattern are laminated in a state of being combined with each other. As a result, the layers that become the layers Lb to Lg after heat treatment are laminated.

Subsequently, the element body forming layer is transferred from the base material onto the layer laminated in the conductor pattern and element body pattern transfer process. In the present embodiment, two element body forming layers are laminated on the layer by repeating the element body forming layer transfer process twice. The element body forming layers become the layer La after heat treatment.

In this manner, the laminate that constitutes the multilayer coil component 1 after heat treatment is formed on the support body. Subsequently, the obtained laminate is cut into a predetermined size. Then, heat treatment is performed after binder removal treatment is performed on the cut laminate. The heat treatment temperature is, for example, approximately 850 to 900° C. If necessary, a plating layer may be provided by performing electroplating or electroless plating on the terminal electrode 3 after the heat treatment.

Subsequently, the glass layer G is formed on the terminal electrode 3. The glass layer G forms a mask that covers a part other than the part forming the glass layer G, and paste containing a glass component is applied (printed). Then, the glass layer G is formed by drying the paste. It should be noted that the glass layer G may be formed by precipitating the glass component contained in the element body 2. The multilayer coil component 1 is manufactured in this manner.

Figure 5:
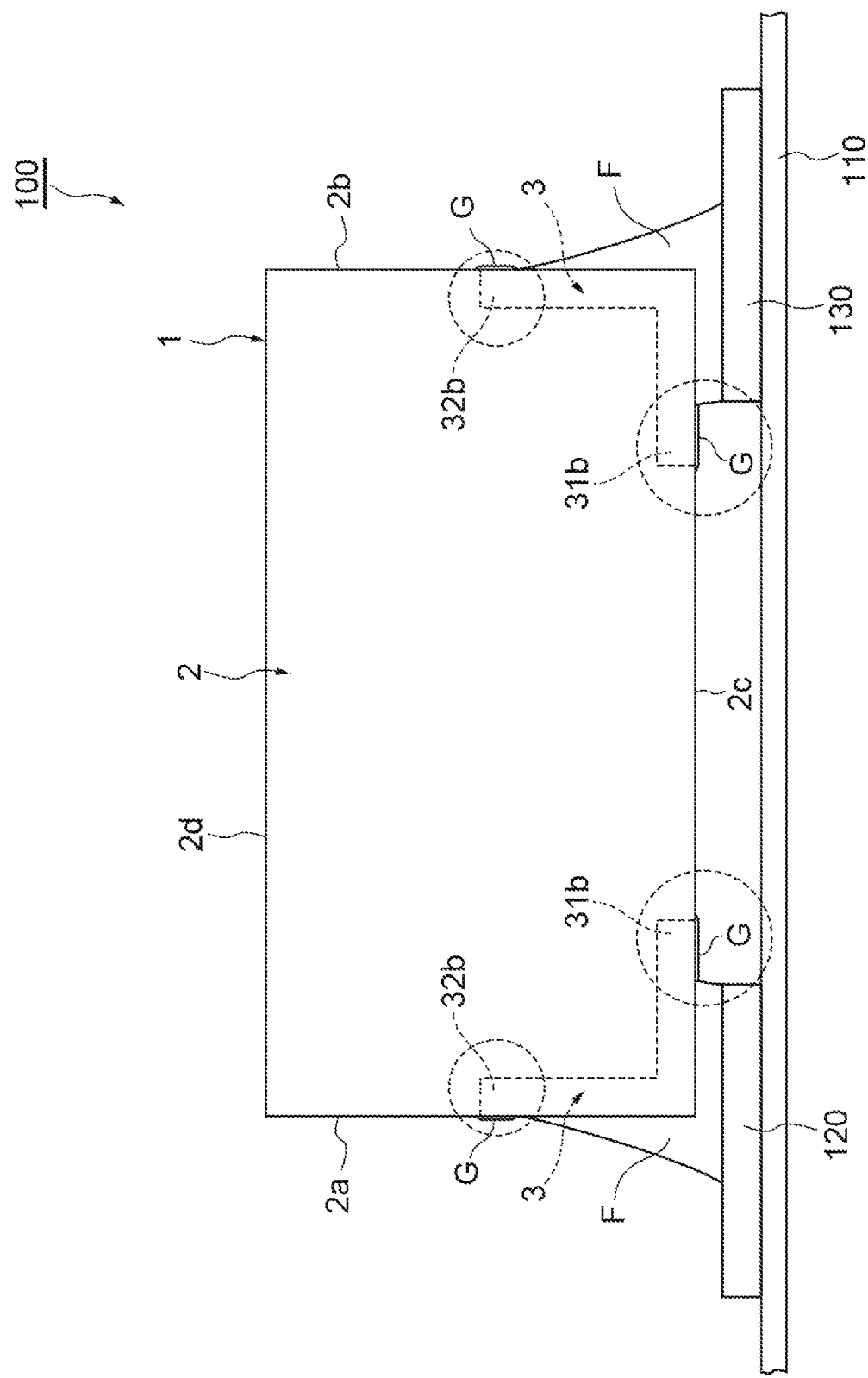
FIG. 5 is a diagram illustrating a mounted structure of the multilayer coil component.

FIG. 5 is a diagram illustrating a mounted structure of the multilayer coil component. As illustrated in FIG. 5, in a mounted structure 100, the multilayer coil component 1 is mounted with solder F on land electrodes 120 and 130 provided on a circuit board 110. One terminal electrode 3 of the multilayer coil component 1 is fixed to the land electrode 120 with the solder F. The other terminal electrode 3 of the multilayer coil component 1 is fixed to the land electrode 130 with the solder F. The solder F is formed over the conductor part 31 and the conductor part 32 of the terminal electrode 3. The solder F is disposed between the conductor part 31 of the terminal electrode 3 and the land electrodes 120 and 130.

In the present embodiment, the solder F is not formed on the glass layer G of the multilayer coil component 1. As a result, as indicated by the part surrounded by the broken line in FIG. 5, in the mounted structure 100 of the multilayer coil component 1, the ends of the land electrodes 120 and 130 and the solder F and the end portion 31b of the terminal electrode 3 do not overlap when viewed from the first direction D1. In other words, in the first direction D1, the positions of the ends of the land electrodes 120 and 130 and the solder F do not match the position of the end portion 31b of the terminal electrode 3. In addition, as indicated by the part surrounded by the broken line in FIG. 5, in the mounted structure 100 of the multilayer coil component 1, the end of the solder F and the end portion 32b of the terminal electrode 3 do not overlap when viewed from the second direction D2. In other words, in the second direction D2, the position of the end of the solder F and the position of the end portion 32b of the terminal electrode 3 do not match.

As described above, in the multilayer coil component 1 according to the present embodiment, the terminal electrode 3 is provided with the plurality of first projecting portions 33 tapered toward the other facing terminal electrode 3 side in the end portion 31b of the conductor part 31. In the multilayer coil component 1 having this configuration, the glass layer G is provided along the edge of the terminal electrode 3 including the first projecting portion 33 in the end portion 31b of the conductor part 31 of the terminal electrode 3. The solder F is not formed on the glass layer G Accordingly, in the multilayer coil component 1, the solder F is not formed on the glass layer G covering the end portion 31b in the event of solder mounting on the land electrodes 120 and 130 of the circuit board 110. As a result, the positions of the ends of the land electrodes 120 and 130 and the solder F do not overlap the position of the end of the terminal electrode 3 when the multilayer coil component 1 is mounted on the land electrodes 120 and 130. In other words, in the first direction D1, the positions of the ends of the land electrodes 120 and 130 and the solder F do not match the position of the end of the terminal electrode 3. Accordingly, stress concentration at the end of the terminal electrode 3 can be avoided in the multilayer coil component 1. As a result, in the multilayer coil component, cracking of the element body 2 in the case of mounting can be suppressed.

In the multilayer coil component 1 according to the present embodiment, the glass layer G covers 60% or more of the area of the first projecting portion 33. In this configuration, formation of the solder F in the end portion 31b of the terminal electrode 3 can be more reliably avoided.

In the multilayer coil component 1 according to the present embodiment, the edge of the glass layer G on the end surface 2a or end surface 2b side has a wave shape corresponding to the first projecting portion 33. In this configuration, a region where the solder F is formed in the terminal electrode 3 can be ensured while the glass layer G covers the edge of the first projecting portion 33.

In the multilayer coil component 1 according to the present embodiment, the pair of terminal electrodes 3 are also disposed in the recessed portions 22 respectively formed on the pair of end surfaces 2a. The end portion 32b on the main surface 2d side at the conductor part 32 of the terminal electrode 3 disposed on the end surface 2a or the end surface 2b is provided with the plurality of second projecting portions 34 tapered toward the main surface 2d side. The glass layer G is provided along the edge of the terminal electrode 3 including the second projecting portion 34 in the end portion 32b of the conductor part 32 of the terminal electrode 3. In this configuration, no solder is formed on the glass layer G covering the end portion 32b in the event of solder mounting on the land electrodes 120 and 130 of the circuit board 110. As a result, the position of the end of the solder F does not overlap the position of the end of the terminal electrode 3 when the multilayer coil component 1 is mounted on the land electrodes 120 and 130. Accordingly, stress concentration at the end of the terminal electrode 3 can be avoided in the multilayer coil component 1. As a result, in the multilayer coil component 1, cracking of the element body 2 in the case of mounting can be suppressed.

Although an embodiment of the present invention has been described above, the present invention is not necessarily limited to the embodiment described above and various modifications can be made without departing from the gist thereof.

Figure 6:
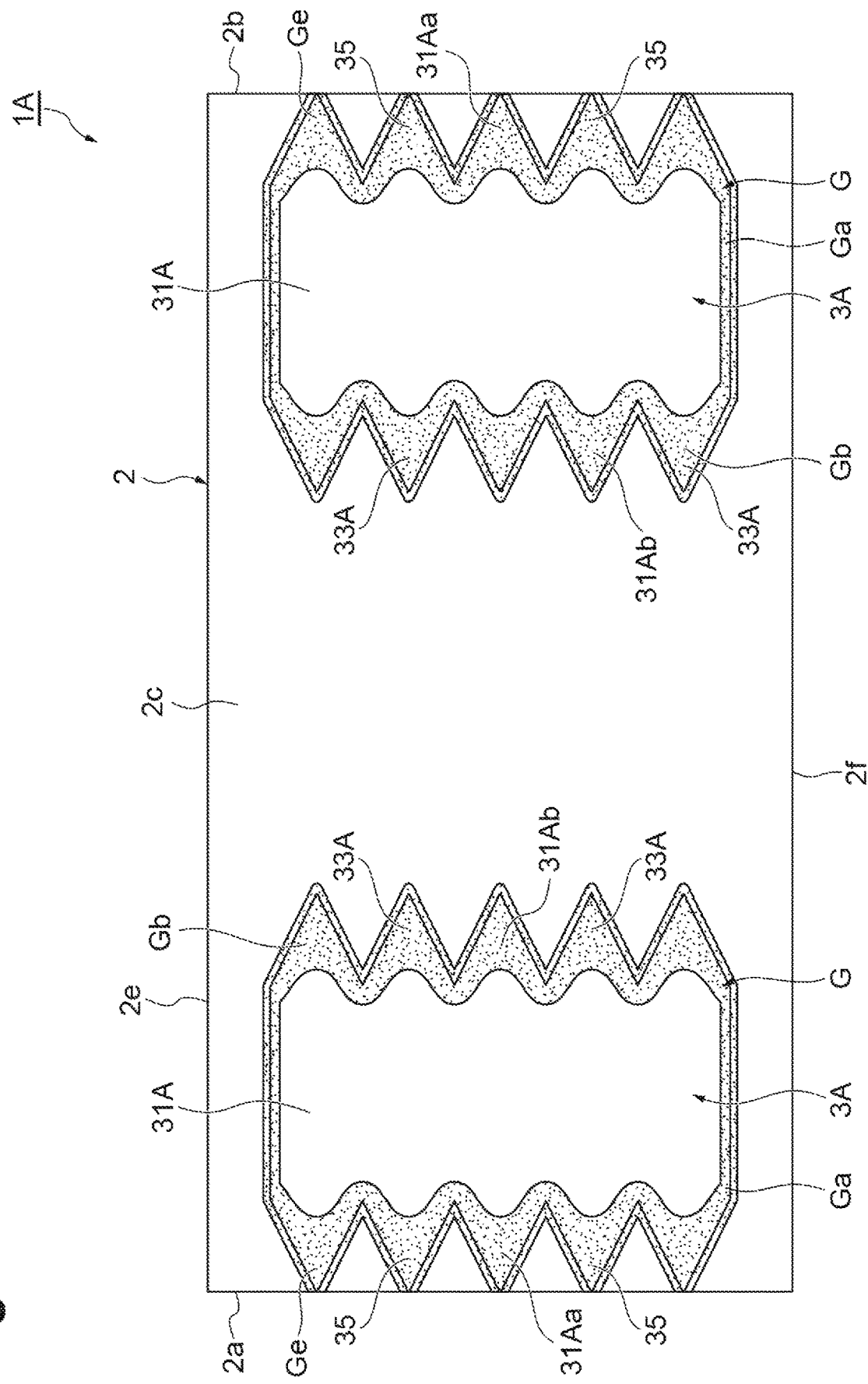
FIG. 6 is a diagram schematically illustrating a main surface of an element body of a multilayer coil component according to another embodiment.

A form in which the terminal electrode 3 has the conductor part 31 and the conductor part 32 has been described as an example in the embodiment described above. However, the terminal electrode 3 may have at least the conductor part 31. As illustrated in FIG. 6, a multilayer coil component 1A includes a terminal electrode 3A. The terminal electrode 3A is provided with a plurality of first projecting portions 33A tapered toward the other facing terminal electrode 3A side in an end portion 31Ab facing the side in the second direction D2 and is provided with a plurality of third projecting portions 35 tapered toward the end surface 2a or end surface 2b side in an end portion (third end portion) 31Aa on the end surface 2a or end surface 2b side. The glass layer G is provided along the edge of the terminal electrode 3A including the first projecting portion 33A and the third projecting portion 35. At a conductor part 31A, the glass layer G is provided in the region Ga along the outer edge on the side surface 2e side and the outer edge on the side surface 2f side, the region Gb covering the first projecting portion 33A of the end portion 31Ab, and a region Ge covering the third projecting portion 35 of the end portion 31Aa.

In this configuration, no solder is formed on the glass layer G covering the first projecting portion 33A and the third projecting portion 35 in the event of solder mounting on the land electrodes 120 and 130 of the circuit board 110. As a result, the positions of the ends of the land electrodes 120 and 130 and the solder F do not overlap the position of the end of the terminal electrode 3A when the multilayer coil component 1A is mounted on the land electrodes 120 and 130.

Accordingly, stress concentration at the end of the terminal electrode 3A can be avoided in the multilayer coil component 1A. As a result, in the multilayer coil component 1A, cracking of the element body 2 in the case of mounting can be suppressed.

A form in which the first projecting portions 33 and 33A, the second projecting portion 34, and the third projecting portion 35 have a triangular shape has been described as an example in the embodiment described above. However, the projecting portion may have a tapered shape and may have, for example, a trapezoidal shape or the like.

What is claimed is:

1. A multilayer coil component comprising:
an element body formed by laminating a plurality of insulator layers and having a pair of end surfaces facing each other, a pair of main surfaces facing each other, and a pair of side surfaces facing each other, one of the main surfaces being a mounting surface;
a pair of terminal electrodes disposed in recessed portions formed on the mounting surface on the respective end surface sides of the element body; and
a glass layer provided on the terminal electrode, wherein
each of the pair of terminal electrodes is provided with a plurality of first projecting portions tapered toward the other facing terminal electrode side in a first end portion facing the side in a facing direction of the pair of end surfaces, and
the glass layer is provided along an edge of the terminal electrode including at least the first projecting portion in the first end portion of the terminal electrode.

2. The multilayer coil component according to claim 1, wherein the glass layer covers 60% or more of an area of the projecting portion.

3. The multilayer coil component according to claim 1, wherein an edge of the glass layer on the end surface side has a wave shape corresponding to the plurality of first projecting portions.

4. The multilayer coil component according to claim 1, wherein
the pair of terminal electrodes are also disposed in recessed portions respectively formed on the pair of end surfaces,
a second end portion of the terminal electrode disposed on the end surface on the other main surface side is provided with a plurality of second projecting portions tapered toward the main surface side, and the glass layer is provided along an edge of the terminal electrode including at least the second projecting portion in the second end portion of the terminal electrode.

5. The multilayer coil component according to claim 1, wherein each of the pair of terminal electrodes is provided with a plurality of third projecting portions tapered toward the end surface side in a third end portion on the end surface side, and the glass layer is provided along an edge of the terminal electrode including at least the third projecting portion in the third end portion of the terminal electrode.

6. A mounted structure of a multilayer coil component comprising:

the multilayer coil component according to claim 1;

a circuit board provided with a land electrode where the multilayer coil component is mounted; and solder disposed between the terminal electrode of the coil component and the land electrode, wherein the solder is not formed on the glass layer, and ends of the land electrode and the solder do not overlap the first end portion of the terminal electrode when viewed from a facing direction of the pair of main surfaces of the element body.

* * * * *